United States Patent [19]

Matsuoka et al.

[11] Patent Number: 5,106,309

[45] Date of Patent: Apr. 21, 1992

[54] IC SOCKET

[75] Inventors: Noriyuki Matsuoka, Yokohama; Kazumi Uratsuji, Tokyo, both of Japan

[73] Assignee: Yamaichi Electric Mfg. Co., Ltd., Tokyo, Japan

[21] Appl. No.: 632,734

[22] Filed: Dec. 26, 1990

[30] Foreign Application Priority Data

Dec. 25, 1989 [JP] Japan ............................ 1-149011[U]

[51] Int. Cl.$^5$ ............................................. H01R 9/09
[52] U.S. Cl. ......................................... 439/71; 439/70; 439/526
[58] Field of Search ............................. 439/70–73, 439/525, 526, 264, 331

[56] References Cited

U.S. PATENT DOCUMENTS

| | | | |
|---|---|---|---|
| 3,605,062 | 9/1971 | Tinkelenberg et al. | 439/526 |
| 3,825,876 | 7/1974 | Damon et al. | 439/526 |
| 4,713,022 | 12/1987 | Pfaff | 439/526 |
| 4,726,777 | 2/1988 | Billman et al. | 439/70 |

*Primary Examiner*—Paula A. Bradley
*Attorney, Agent, or Firm*—Wenderoth, Lind & Ponack

[57] ABSTRACT

An IC socket comprises a socket board having an IC mount table. Contacting portions of tips of a plurality of contacts arranged in parallel relation on the socket board are inserted into a plurality of positioning holes which are arranged in parallel relation on a marginal portion of the IC mount table in order to contact with corresponding contacting pieces of an IC which is placed on the IC mount table. Dividing ridges are formed by lower ends of the partition walls on the entrance side thereof for the contacts, the dividing ridges being formed between the adjacent positioning holes arranged in parallel relation.

5 Claims, 4 Drawing Sheets

IC SOCKET

BACKGROUND OF THE INVENTION

1. Field of the Invention

This invention relates to an IC socket comprising a socket board provided with an IC mount table.

2. Brief Description of the Prior Art

Japanese Patent Early Laid-open Publication No. Sho 63-291375 discloses an IC socket comprising a socket board provided with an IC mount table, the socket board being provided with a plurality of contacts arranged in parallel relation. Contacting portions of the tips of the contacts are inserted into a plurality of positioning holes arranged likewise in parallel relation on the marginal portion of the IC mount table to contact with contacting pieces of an IC.

In the above IC socket, the contacts implanted in the socket board are positioned in the neighborhood of contacting points closest to the IC contacting pieces by the IC mount table so as to be correspond correctly to the IC contacting pieces which are placed on the IC mount table.

However, while the above IC socket has such an advantage as that the contacts and the IC contact pieces can correspond correctly each other, it has such a short coming as that when the IC mount table 2 is assembled to the group of contacts 1 arranged in parallel relation and at micro pitches on the socket board as shown in FIG. 11, much difficulty is encountered to correctly match the group of positioning holes 3 arranged in parallel relation and at micro pitches on the IC mount table 2 to the group of contacts 1 and insert the one into the other as one group. Therefore, much labor and time are required for assembly.

Moreover, if some of the contacts in the group of contacts 1 are bent to one side as illustrated, in addition to the above-mentioned difficulty of properly matching and inserting the contact with the positioning holes as one group, there arises another problem. That is, if the operator unfortunately fails to notice the existence of the bent contacts 1 and tried hard to press them into the IC mount table 2, the contacting portions of the tips of the contacts would be bent and deformed by the partition walls formed between the adjacent positioning holes 3. As a result, the IC socket including the IC mount table 2 becomes an inferior product.

SUMMARY OF THE INVENTION

It is therefore a general object of the present invention to solve the above-mentioned problems.

As a means thereof, a lower end of the entrance side of a partition wall formed between adjacent positioning holes arranged in parallel relation as discussed above is formed into a dividing ridge between the adjacent positioning holes. The above-mentioned contacts bent to one side being portioned out by the dividing ridge so as to be guided into the corresponding positioning hole.

According to the present invention, when the IC mount table is assembled to the group of contacts, the positioning holes arranged in parallel relation at micro pitches on the IC mount table are dilated by the dividing ridge, so that the positioning holes properly correspond to the group of contacts and the contacts are inserted with ease, and a quick assembly can be attained.

If some of the contacts among the group of contacts are bent to one side, the contacting portions of the tips of the contacts are slidingly portioned out with the inclined surfaces formed by the dividing ridges so as to be guided to the corresponding positioning holes.

The above and other objects, advantages and features of the present invention will become more apparent as the description proceeds upon making reference to the accompanying drawings.

DETAILED DESCRIPTION OF THE EMBODIMENT

Figure 1:
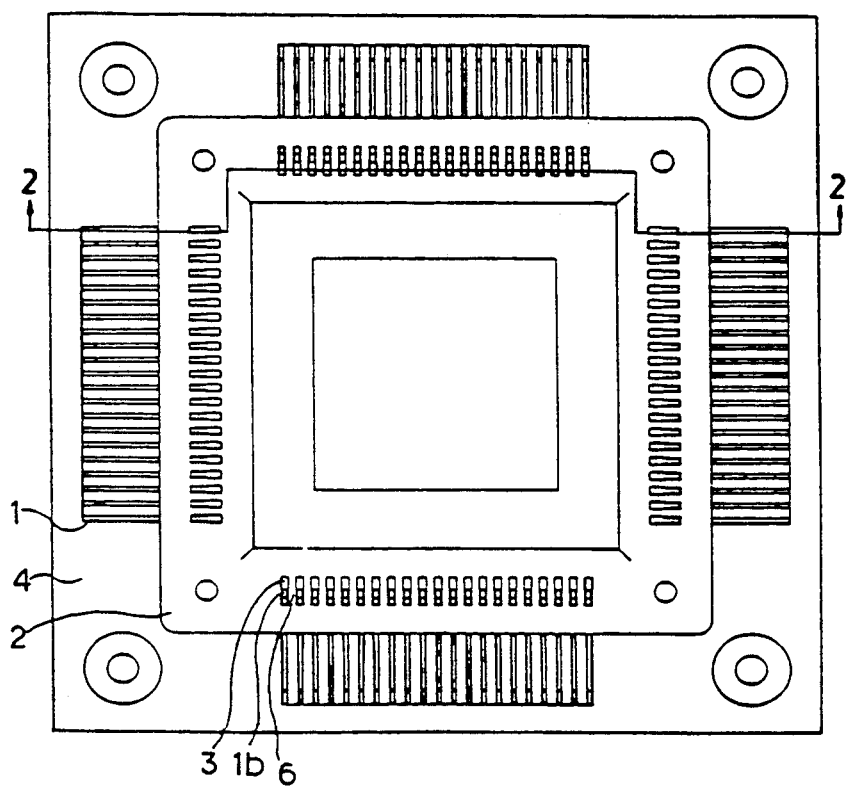
FIG. 1 is a plan view of an IC socket showing one embodiment of the present invention.
Figure 2:
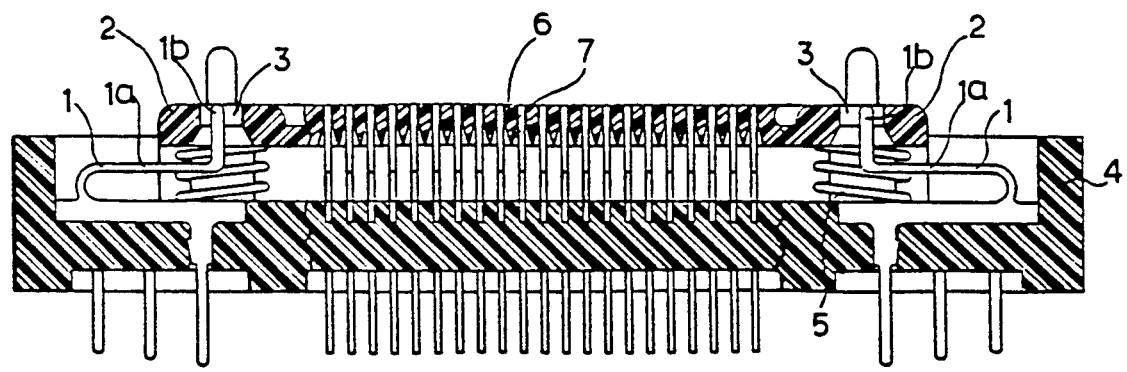
FIG. 2 is a sectional view taken on line A—A of FIG. 1.

The embodiment of the present invention will be described hereunder with reference to FIGS. 1 through 10.

The numeral 4 denotes a socket board formed of a square insulating board. The socket board 4 is provided in a central portion of its upper surface with an IC mount table 2 which can be moved upward and downward. The socket board 4 has a plurality of contacts 1 arranged in parallel relation along the outer four sides or two sides of the IC mount table 2.

The IC mount table 2 is resiliently supported by, for example, a spring 5 disposed between the socket board 4 and the IC mount table 2. The IC mount table 2 is moved downward against the spring 5 and upward in accordance with the spring 5, and held in a predetermined raised position.

The IC mount table 2 is provided with a plurality of positioning holes 3 arranged in parallel relation on the outer four sides or two sides. The positioning holes 3 are adapted to receive contacting portions of the tips of the contacts 1 for positioning. A number of positioning holes 3 corresponding to that of the contacts are arranged in parallel relation at the pitch of the contacts, and thus at the same pitch as IC contact pieces 9a as illustrated, in order to catch the individual contacts 1.

On the other hand, the contacts 1 are implanted in the socket board 4 portion at the outer peripheral portion of the IC mount table 2. The contacts 1 have a resilient contacting piece 1a extending toward the IC mount table 2 from the implanted portion, and the contacting portions 1b of the tips of the resilient contacting pieces 1a are inserted into the positioning holes 3 in the manner as mentioned above. The resilient contacting pieces 1a of the contacts 1 are restricted in sideward displacement at the contacting portion 1b in the positioning holes 3. As a result, a relative position of the IC mount table and the contacts is established. At the same time, when the IC mount table 2 is moved forwardly and backwardly or rightwardly or leftwardly in the horizontal direction by a micro-amount, the resilient contacting pieces 1a of the contacts are also displaced to maintain the relative position with the IC mount table 2.

Each of the positioning holes 3 arranged in parallel relation has a partition wall 6 formed at a space between the adjacent positioning holes 3 adapted to individually partition the positioning holes 3. A lower end of each of the partition walls 6 forms a dividing ridge 7 between the adjacent positioning holes 3. The adjacent positioning holes 3 are connected through each dividing ridge 7, respectively. The dividing ridge 7 has a pair of downwardly inclined surfaces 7a and 7b formed on both sides thereof and for portioning out the adjacent contacts which are adjacent to each other with reference to the ridge line of the dividing ridge 7 and guiding the contacts into the corresponding positioning holes 3. The positioning holes 3 are dilated on the entrance side of the contacts by the inclined surfaces 7a and 7b.

Also, the edge of the partition hole 3 on the side adjacent to the partition wall 6 is formed with an inclined surface 8 enlarging downwardly and continuously connected with the downwardly inclined surfaces 7a and 7b formed on both sides of the dividing ridge 7. That is, the positioning holes 3 are dilated rightwardly and leftwardly at spaces between the adjacent positioning holes 3, and further dilated in the forward and backward direction by the inclined surfaces 8.

Figure 3:
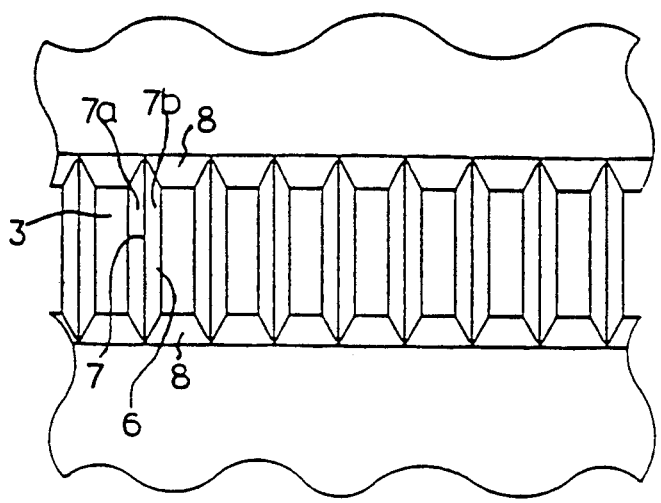
FIG. 3 is a plan view showing an example of a parallel arrangement of positioning holes and dividing ridges.
Figure 4:
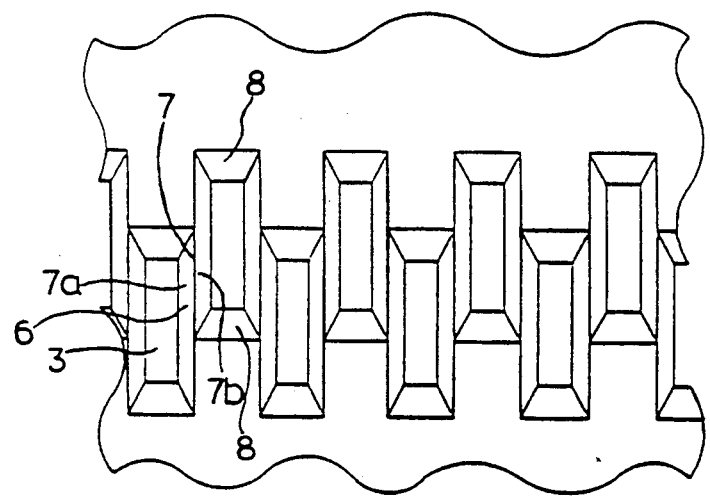
FIG. 4 is a plan view showing another example of a parallel arrangement of the positioning holes and the dividing ridges.

As is shown in FIGS. 3 or 4, the positioning holes 3 are formed in a rectangular shape, respectively. Furthermore, the positioning holes 3 are arranged to have a similar phase and be in parallel relation through the dividing ridges as shown in FIG. 3. Otherwise, the positioning holes 3 are arranged to have a different phase and in a zigzag fashion, likewise through the dividing ridges, as shown in FIG. 4. The dividing ridges 7 of FIGS. 3 and 4 are formed on short sides between the adjacent positioning holes 3.

Figure 5:
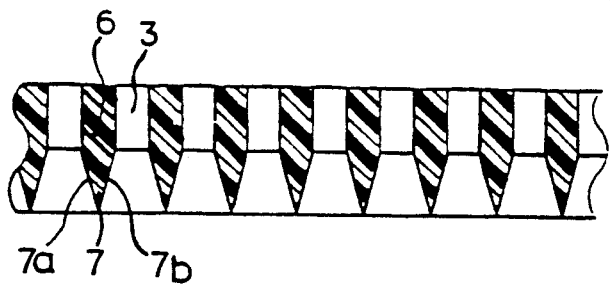
FIG. 5 is a sectional view of the positioning holes showing the configurations of the dividing ridges.
Figure 6:
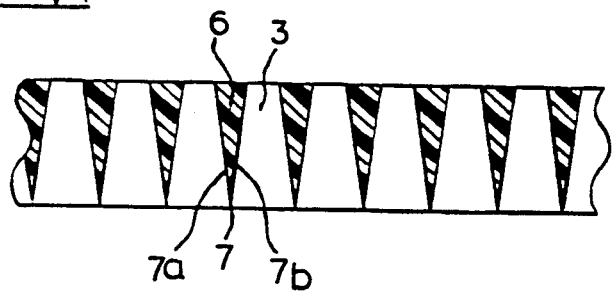
FIG. 6 is a sectional view of the positioning holes showing another example of the configurations of the dividing ridges.

Also, in a modified embodiment of the dividing ridge 7, the pair of downwardly inclined surfaces 7a and 7b forming the dividing ridge 7 are formed as far as a midway point of each positioning hole as shown in FIG. 5, or formed as far as the exit of each positioning hole as shown in FIG. 6.

Figure 10A:
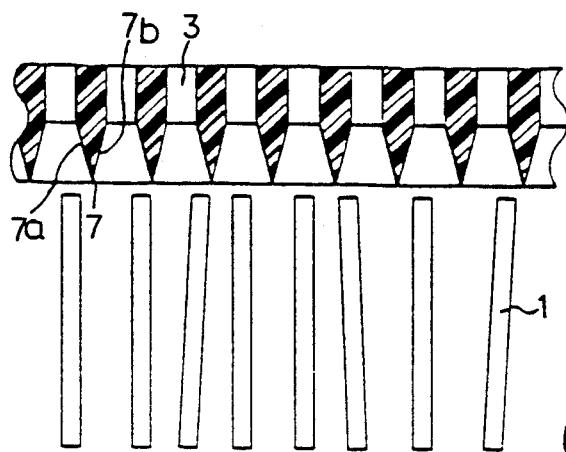
FIGS. 10(A), 10(B) and 10(C) are sectional views for explaining the function of the dividing ridges when the IC mount table is assembled with the contacts.
Figure 10B:
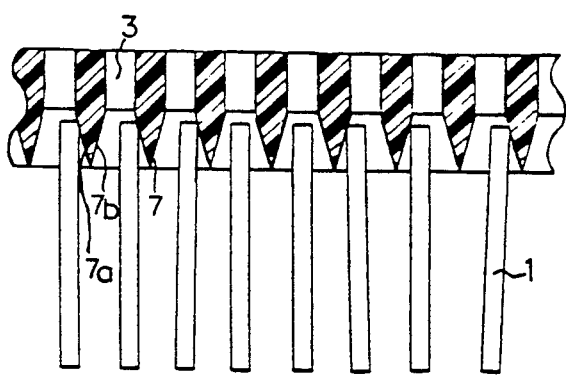
Figure 10C:
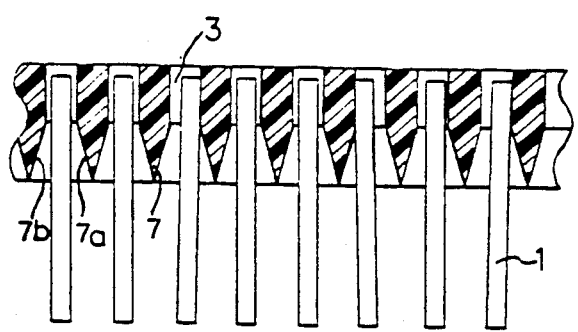
Figure 11:
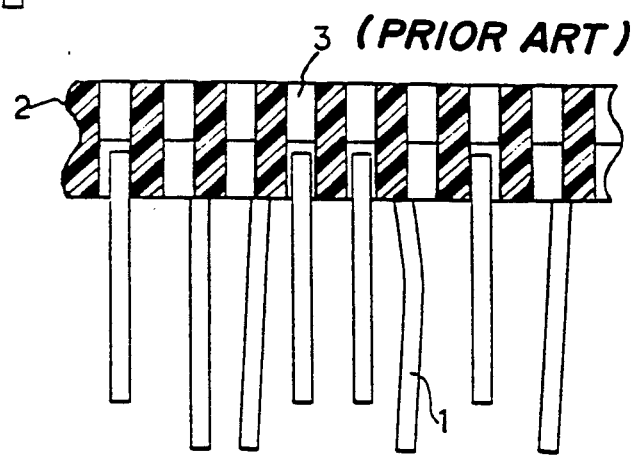
FIG. 11 is a sectional view for explaining a state when the conventional IC mount table is assembled with the contacts.

In this way, as is shown in FIGS. 10(A) through 10(C), when the IC mount table 2 is assembled to the group of contacts 1 arranged in parallel relation and at micro pitches on the socket board 4, the respective contacts 1 are surely portioned out rightwardly and leftwardly by the dividing ridges 7 of the partition walls 6 of the adjacent positioning holes 3, arranged in parallel relation and at micro pitches on the IC mount table 2. As a result, the group of positioning holes 3 can properly correspond to, and have inserted therein, the group of contacts 1 as one group.

Figure 7:
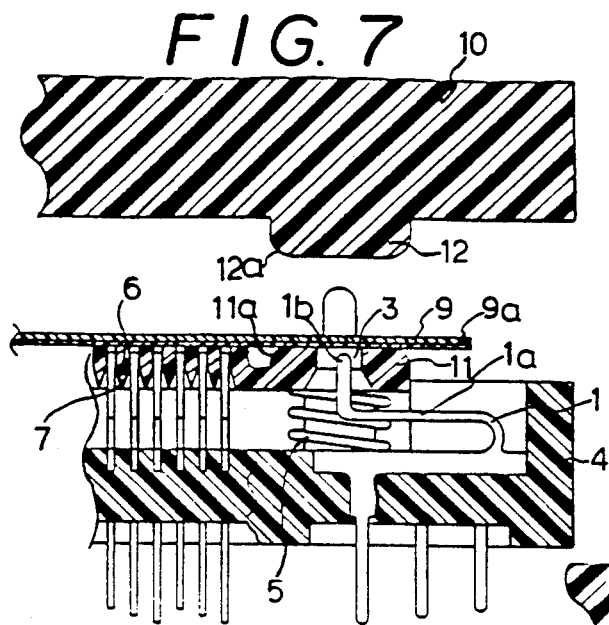
FIG. 7 is a sectional view of a socket with an IC loaded therein, wherein contacting portions of the tips of the contacts are already inserted into the positioning holes.

That is, even when a part of the group of contacts 1 is bent to one side, the contacts 1 can be correctly guided into the corresponding positioning holes 3 by slidingly portioning out the contacting portions 1b of the tips of the contacts by the downwardly inclined surfaces 7a and 7b formed on the dividing ridges 7. In this case, as is shown in FIG. 7, the contacting portions of the tips of the contacts are held in a state hidden in the positioning holes 3. Or as a modified embodiment shown in FIG. 8, the contacting portions of the tips of the contacts 1 are held in a state projecting outwardly from the exit side of the positioning holes 3.

As is shown in FIG. 7, a flat IC 9 is placed on the IC mount table 2. By closing an IC presser cover 10 relative to the socket board 4 in the way as shown in FIG. 9, the IC 9 is pressed together with the IC mount table 2 downwardly against the spring 5, and as a reaction, the contacting portions 1b of the tips of the contacts 1 are abutted against the IC contacting pieces 9a and bent to obtain a contacting pressure by the restoring force thereof.

Figure 8:
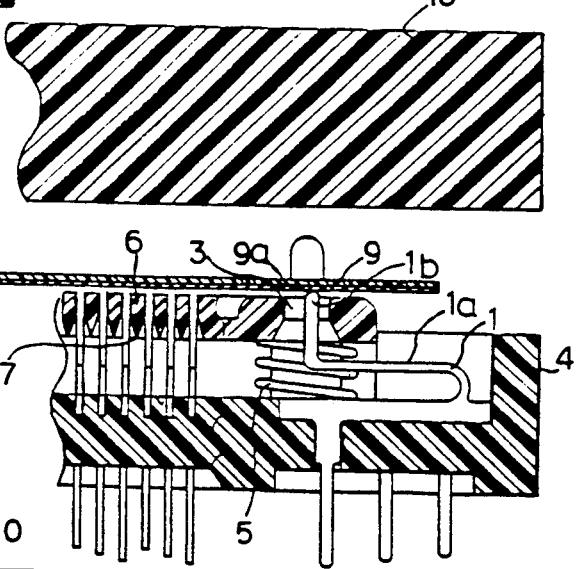
FIG. 8 is a sectional view of a socket with an IC loaded therein, wherein the contacting portions of the tips of the contacts project from the positioning holes.

Furthermore, as is shown in FIG. 8, the flat IC 9 is contacted with the contacting portions 1b of the tips of the contacts 1 projecting from the positioning holes 3 and placed on the IC mount table 2. Then, as is shown in FIG. 9, the same contacting relation as mentioned above can be obtained by closing the IC presser cover 10 relative to the socket board 4.

As is shown in FIGS. 1, 2, and 7 through 9, the peripheral four sides or two sides of the IC mount table 2 project in a pillow shape to form an IC supporting pad 11, and the positioning holes 3 open up at the IC supporting pads 11.

Figure 9:
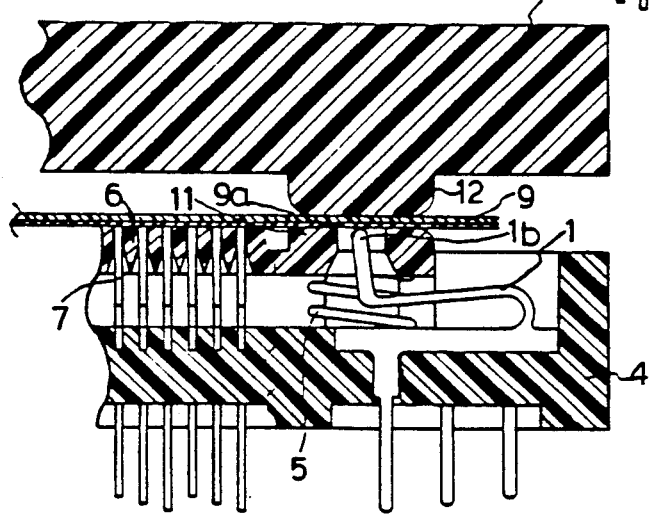
FIG. 9 is a sectional view of a socket, wherein an IC is pressed by a presser cover so as to be contacted with the contacts.

Furthermore, as is shown in FIGS. 7 and 9, the IC presser cover 10 is provided with an IC pressing pad 12 corresponding to the IC supporting pad 11 and projecting from the inner surface of the IC presser cover 10. Angular edges 12a of the presser surface of the IC presser pad 12 and the angular edges 11a of the supporting surface of the IC supporting pad 11 are formed in an arcuate shape, respectively. The edge portion of the IC 9 is held between the IC presser pad 12 and the IC supporting pad 11 to realize the contacting relation with the contacts 1. At that time, the angular edges 12a of the presser surface and the angular edges 11a of the supporting surface are with formed in an arcuate shape in order to prevent the IC contacting pieces 9a and the outer surface of the body of the IC 9 from being damaged.

As described above, according to the present invention, when the IC mount table is assembled to the group of contacts arranged in parallel relation and at micro pitches on the socket board, the contacts can be accurately portioned out rightwardly and leftwardly by the dividing ridges of the partition walls, the adjacent positioning holes being arranged in parallel relation and at micro pitches, and then the group of positioning holes can properly correspond to and have inserted therein the group of contacts as one group. As a result, the work for matching the group of positioning holes to the group of contacts for assembly can be performed easily and rapidly. Therefore, there can be effectively eliminated such an inconvenience as deforming the contacts by mistake when the IC mount table is assembled.

Furthermore, even when a part of the group of contacts is bent to one side, the contacts can be correctly guided into the corresponding positioning holes by slidingly portioning out the contacting portions of the tips of the contacts by the downwardly inclined surfaces forming the dividing ridges.

What is claimed is:

1. An IC socket, comprising:
   a socket board including an IC socket mount table;
   a plurality of contacts arranged in parallel relation on said socket board, said contacts having tips which have contacting portions thereon; and
   a plurality of positioning holes arranged in parallel relation on a marginal portion of said IC mount table for receipt of said contacting portions of said tips of said contacts for contacting contact portions of an IC on said IC mount table, adjacent pairs of said positioning holes having a common partition wall, and each said partition wall having tapered surfaces on opposite sides thereof tapering to a linear point intersection for smoothly guiding said contacting portions from between adjacent said positioning holes into a respective said positioning hole.

2. The IC socket of claim 1, wherein said positioning holes are rectangular in shape and arranged in said parallel relation in a linear pattern, said common partition wall forming one rectangular side for each said positioning hole of said adjacent pair of positioning holes.

3. The IC socket of claim 1, wherein said positioning holes are rectangular in shape and arranged in said parallel relation in a zig-zag pattern, said common partition wall forming one rectangular side for each said positioning hole of said adjacent pair of positioning holes.

4. The IC socket of claim 1, wherein said common partition wall has said tapered surfaces thereon only on a lower half thereof.

5. The IC socket of claim 1, wherein said common partition wall has said tapered surfaces thereon over their entire extent.

* * * * *